United States Patent [19]
McNicol

[11] Patent Number: 5,770,971
[45] Date of Patent: Jun. 23, 1998

[54] DISTORTION COMPENSATION CONTROL FOR A POWER AMPLIFIER

[75] Inventor: John Duncan McNicol, Ottawa, Canada

[73] Assignee: Northern Telecom Limited, Montreal, Canada

[21] Appl. No.: 690,434

[22] Filed: Jul. 26, 1996

[51] Int. Cl.$^6$ .................................. H03F 3/66; H03F 1/26
[52] U.S. Cl. .......................... 330/52; 330/149; 330/151
[58] Field of Search .......................... 330/52, 149, 151; 332/159, 161

[56] References Cited

U.S. PATENT DOCUMENTS

| | | | |
|---|---|---|---|
| 4,879,519 | 11/1989 | Myer | 330/149 |
| 4,885,551 | 12/1989 | Myer | 330/52 |
| 5,155,448 | 10/1992 | Powell | 330/149 |
| 5,193,224 | 3/1993 | McNicol et al. | 455/126 |
| 5,508,657 | 4/1996 | Behan | 330/151 |
| 5,621,354 | 4/1997 | Mitzlaff | 330/52 |

*Primary Examiner*—Steven Mottola
*Attorney, Agent, or Firm*—Jeffrey M. Measures

[57] ABSTRACT

A control arrangement and method for controlling a gain and phase adjuster used for controlling the gain and phase of a compensation signal for compensating for the distortion produced by a power amplifier is disclosed. The control arrangement makes use of a reference signal, of known frequency, which is amplified along with the desired carrier signals. The reference signal component of the amplified signal is then isolated and a comparison is made, either with the actual reference signal, e.g., by a QAM demodulator, or alternatively with the known frequency of the reference signal, e.g., by a FM discriminator, in order to determine the differences in gain and in phase of the reference signal component of the amplified signal in comparison with the reference signal. For example, a QAM demodulator is used for producing a first difference signal indicative of the phase switch difference, and a second difference signal indicative of the gain switch difference. These signals are then correlated with the signal envelope of the main signal in order to produce signals indicative of the sign and magnitude of the control signals used to adjust the gain and phase adjuster in a feed back loop.

19 Claims, 5 Drawing Sheets

DISTORTION COMPENSATION CONTROL FOR A POWER AMPLIFIER

This invention relates to the control of a distortion compensation arrangement for a power amplifier, such as a multi-channel linear power amplifier for a cellular radio communications system.

BACKGROUND OF THE INVENTION

As is well known, an RF amplifier operating at high power levels has non-linear amplifier characteristics which produce undesired intermodulation distortion due to interaction between signals being amplified.

In order to compensate for the non-linear characteristics, prior art systems provide distortion compensation arrangements in which a part of the incoming signal is subtracted, with appropriate delay, and phase and gain adjustments, from a part of an amplified signal which is subject to the non-linear amplifier characteristics to isolate a distortion signal component. This distortion signal is a form of compensation signal used to predistort the main signal in order to compensate for the distortion prior to amplification. Other known systems use a "feed forward" arrangement where the compensation signal comprises an adjusted copy of the original signal which is used to compensate for the distortion after amplification. Prior art systems, for example, those taught in U.S. Pat. No. 4,879,519 issued Nov. 7, 1989, naming Robert E. Myer as inventor, entitled "Predistortion Compensated Linear Amplifiers", and U.S. Pat. No. 4,885,551 issued Dec. 5, 1989, naming Robert E. Myer as inventor, entitled "Feed Forward Linear Amplifier" recognize the difficulty of controlling the compensation because this requires modifying the gain and phase of the compensation (e.g., the predistortion) signal component to match the gain and phase shift of the amplified signal on a continuing basis in order to compensate for changes in operating conditions. To this end, these patents describe the use of frequency scanning for sensing the presence of an intermodulation signals. The system controls are then adjusted in order to reduce such intermodulation signals below a predefined threshold, using an iterative, trial and error approach. In such systems, an initial adjustment is made to the compensation signal. The output is then frequency scanned in order to evaluate the results of the initial adjustment. If such an adjustment does not reduce the intermodulation signals below the threshold, another adjustment is made. The resulting intermodulation signal detected by the frequency scanning process is then compared with the previous intermodulation signal in order to determine the next adjustment. This iterative approach is continued until the intermodulation signals are below a predefined threshold or a predetermined number of adjustments have been made. Such an approach can take a period of time while the iterative adjustments are made before the intermodulation products are suitably reduced. During this time period, unwanted distortion is potentially produced by such a system.

There exists a need for a system which promptly determines the gain and phase adjustments required for the compensation signal to minimize the distortion signals produced.

SUMMARY OF THE INVENTION

An object of this invention is to provide a compensation arrangement for a linear power amplifier which adaptively controls the gain and phase of the compensation signal component in order to reduce the total distortion produced by the system.

Another object of the invention is to provide a compensation arrangement which promptly determines the gain and phase adjustments required for the compensation signal to minimize the distortion signals produced.

The invention makes use of a reference signal, of known frequency, which is amplified along with the desired carrier signals. Such a system evaluates the errors introduced to the known reference signal, and determines the errors, (e.g., the intermodulation distortion) produced by the amplification of the reference signal by the power amplifier. These error signals are then used to determine the actual adjustments to the compensation signal which reduce the resulting error signals. Thus, a control loop is introduced which, by reducing the distortion introduced to the reference signal, reduces the overall distortion introduced to the carriers.

Such a reference signal can be added to the carriers prior to amplification and then subsequently canceled. Alternatively, if the carriers to be amplified include a suitable signal which is continuously present, such a signal can be used as the reference signal. In the preferred embodiment, the distortion (e.g., the intermodulation products surrounding the reference signal frequency) introduced to said reference signal is evaluated by comparing an unamplified copy of the reference signal with the reference signal component of the combined signal amplified by the amplifier. A quadrature amplitude modulation (QAM) demodulator is used for this purpose. In another embodiment of the invention, the distortion introduced to the reference signal is evaluated by using an FM discriminator centered at the known frequency of the reference signal and an envelope detector.

According to one aspect of the invention, there is provided a distortion compensation circuit for a power amplifier comprising an input path for forwarding a combined signal to the amplifier to form an amplified signal, the combined signal comprising at least one carrier and a reference signal; a compensation path for producing a compensation signal for compensating for the distortion produced by the amplifier; a control unit; coupler for coupling the amplified signal to the control unit; the control unit comprising error signal means for producing a first signal indicative of the AM/AM distortion within an amplified reference signal component of said amplified signal and for producing a second signal indicative of the AM/PM distortion within said amplified reference signal component, an envelope detector for detecting the instantaneous RF signal envelope of said amplified signal, a first mixer for correlating said first signal with said signal envelope in order to form a first error signal, and a second mixer for correlating said second signal with said signal envelope in order to form a second error signal; a gain and phase adjuster, responsive the control unit, for adjusting the gain and phase of the compensation signal in order to minimize the error signals.

According to another aspect of the invention, there is provided a method of minimizing the intermodulation distortion produced by a RF power amplifier comprising the steps of:

(a) introducing an RF signal to be amplified, the RF signal including a reference signal;

(b) producing a compensation signal which will largely cancel the distortion produced by the RF power amplifier;

(c) producing a pair of error signals indicative of the sign and magnitude of the distortion introduced by the RF power amplifier to the reference signal;

(d) adaptively adjusting the gain and phase of the compensation signal in order to minimize the error signals.

BRIEF DESCRIPTION OF THE DRAWINGS

The present invention, together with further objects and advantages thereof will be further understood from the following description of example embodiments with reference to the drawings in which.

DETAILED DESCRIPTION OF THE PREFERRED EMBODIMENTS

The preferred embodiment of the invention will be described with respect to its implementation for controlling a predistortion arrangement. It should be appreciated that the control mechanism can also be suitably adapted for use in controlling the compensation signal used in a feed forward system.

Figure 1:
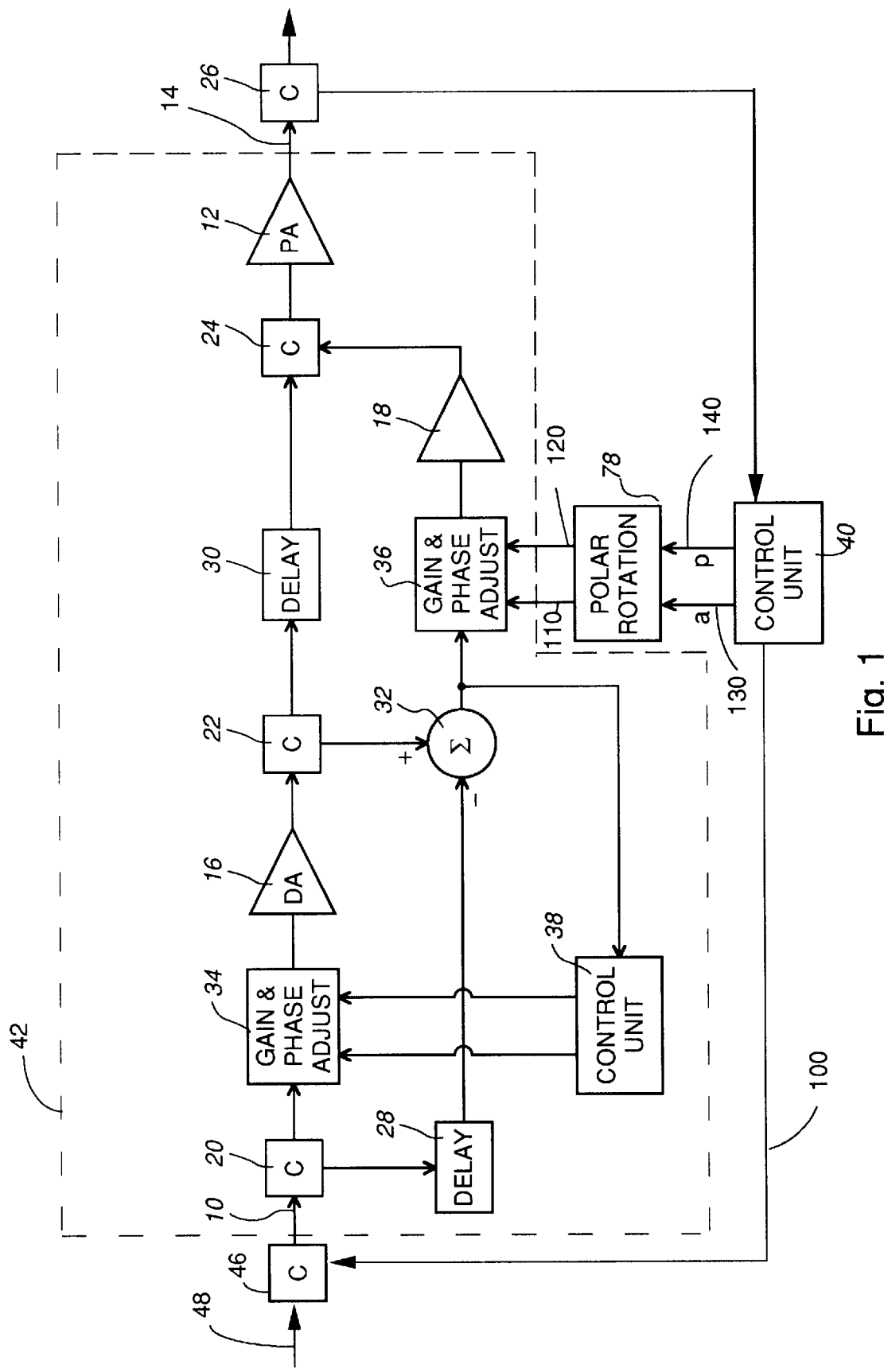
FIG. 1 schematically illustrates one embodiment of the invention incorporating a power amplifier with a predistortion compensation arrangement.

Referring to FIG. 1, there is illustrated an input 48 for an RF signal to be amplified, a linear power amplifier (PA) 12, couplers 46 and 26, an output 14 for an amplified RF signal, a predistortion compensation arrangement which is constituted by the components inside box 42, a control arrangement 40 and a polar rotation unit 78. The RF signal is, for example, a multi-channel signal including multiple channels with frequencies within a portion of the 25 MHz band from 869 to 894 MHz for use in a cellular radio communications system. The distortion compensation arrangement 42 serves to compensate for non-linear characteristics of the amplifier 12, especially at higher powers, thereby reducing intermodulation distortion among the multiple channels.

The predistortion compensation arrangement comprises a driver amplifier (DA) 16 which has characteristics closely matched to those of the power amplifier 12; a further amplifier 18; couplers (C) 20, 22, and 24; delay units 28 and 30; a subtracter 32; gain and phase adjustment units 34 and 36; and control unit 38 for controlling unit 34. The predistortion and power amplifier arrangement (PD & PA) within box 42 is known.

As shown in FIG. 1, control signals for gain and phase adjustment unit 36, which originate from control unit 40 pass through polar rotation box 78.

Referring to box 42 of FIG. 1, the incoming signal from the input 48 is coupled to a reference signal 100 originating from control unit 40 via coupler 46. This combined signal 10 is then coupled to the input of the power amplifier 12 via coupler 20, the gain and phase adjustment unit 34, the driver amplifier 16, the coupler 22, the delay unit 30, and the coupler 24 in sequence. A portion of the signal amplified by the driver amplifier 16 is coupled by the coupler 22 to an additive (+) input of the subtracter 32, a subtractive (−) input of which is supplied with a portion of the incoming signal 10 from the coupler 20, after a compensating delay provided by the delay unit 28. An output 33 of the subtracter 32 is supplied as a feedback signal to the control unit 38, which controls the gain and phase adjustment unit 34 to substantially eliminate components of the incoming signal at the output of the subtracter 32. Consequently, the output 33 of the subtracter 32 is a distortion signal component due to non-linearity or distortion in the driver amplifier 16, corresponding (because of the close matching of the amplifier 16 to the amplifier 12) to non-linearity or distortion in the power amplifier 12. It should be appreciated that the gain and phase adjustment unit 34 could alternatively be provided at other positions in either of the input paths to the subtracter 32. The arrangement shown has the advantage of positioning unit 34 in a feedback loop capable of compensating for gain variations of amplifier 16 resulting from changes in operating conditions, such as variations in temperature, supply voltage, aging components, etc., which do not occur in the path from 20 to 28 to 32.

Thus, elements 20, 34, 16, 22, 28, 32, and 38 serve the primary function of producing distortion signal 33 as the output of the subtracter 32 which closely approximates the distortion added by amplifier 12, as is known in the art. This distortion signal 33 is then used to predistort the main signal to be amplified as follows.

This distortion signal 33 is then supplied, via the gain and phase adjustment unit 36, to the amplifier 18 in which the signal is amplified. The signal also undergoes a 180 degree phase shift, effectively inverting the signal, in either the amplifier 18 or the adjuster 36. The output of the amplifier 18 is supplied to the coupler 24, in which the amplified distortion signal is subtracted (because of its inversion) from the amplified combined signal (i.e., the output from DA16), the combined signal being provided with a compensating delay in the delay unit 30. After the subtraction in coupler 24, the predistorted signal is supplied to the power amplifier 12.

Gain and phase adjustment unit 36 has two adjustable input settings (or parameters). One parameter, which in FIG. 1 is controlled by signal 110, adjusts the gain of the distortion signal passing through the unit. The second parameter, which in this case is controlled by signal 120, adjusts the phase of the distortion signal passing through the unit. The settings of gain and phase adjustments in unit 36 are initially preset in order to produce a distortion signal passing into amplifier 12 which will largely cancel the distortion signal produced by amplifier 12, thus minimizing the intermodulation distortion at output 14, as is known in the art.

A portion of the output signal 14 from the power amplifier 12 is coupled by the coupler 26 back to the control unit 40 to form a feedback loop, which controls the gain and phase adjustment unit 36. This feed back loop adjusts the settings of unit 36 in order to adaptively compensate for changes in operating conditions, such as variations in temperature, humidity, power supply voltage, aging components, etc..

Two types of distortion which are produced by PA12 are AM/AM (amplitude modulation to amplitude modulation distortion) and AM/PM (amplitude modulation to phase modulation distortion). For small errors in the settings in unit 36, the effect on the composite non-linearity of the entire system is as follows: errors in the gain control signal 110 result in a composite non-linear distortion of the same type (AM/AM or AM/PM) as that produced by amplifiers 16 and 12, whereas errors in the phase control signal 120 result in a composite non-linear distortion of the opposite type as that produced by amplifiers 16 and 12.

For example, let us assume amplifiers 16 and 12 produced only AM/PM (phase-rotation dependent on the input signal envelope). For such an amplifier, an error in the gain control signal 110 results in a composite AM/PM (same type distortion) whose sign and magnitude are proportional to the gain setting error, whereas an error in the phase control signal 120 results in a composite AM/AM (RF gain dependent on input signal envelope; i.e., opposite type distortion) whose sign and magnitude are proportional to the phase setting error. Similarly if amplifiers 16 and 12 only produced AM/AM distortion, then the gain control signal 110 adjusts the composite AM/AM distortion and the phase control signal 120 adjusts the composite AM/PM distortion.

An amplifier typically exhibits both AM/AM and AM/PM in some weighted combination. Therefore, an error in the gain control setting 110 produces a similarly weighted combination of AM/AM and AM/PM distortion and an error in the phase control setting 120 produces a differently weighted combination of AM/AM and AM/PM distortion. For the purposes of automating control in accordance with the embodiment of the invention shown in FIGS. 1 and 2, control unit 140 produces a pair of control signals (a, p), wherein "a" is an AM/AM distortion compensation control signal, and "p" is an AM/PM distortion compensation control signal, as will be explained below. A polar rotation is applied to the pair of control signals (a, p) produced by control unit 140, which is a complex number, in polar rotation unit 78 in order to produce the gain control signal 110 and the phase control signal 120. This is done in such a manner that changes in the "a" control signal results in largely AM/AM distortion, and changes in the control signal "p" results in largely AM/PM distortion. Polar rotation unit 78 produces gain control signal 110=a*cos(theta)+p* sin (theta) and produces phase control signal 120=a* sin(theta) −p*cos(theta), where theta is a fixed angle selected according to the mix of AM/AM and AM/PM produced by the amplifiers. For example, for amplifiers dominated by AM/AM theta is close to zero degrees while for amplifiers with mostly AM/PM, theta is close to 90 degrees. For amplifiers which produce similar amounts of AM/AM and AM/PM theta is close to 45 degrees. This actual setting for theta in polar rotation unit 78 is set initially depending on the characteristics of PA 12.

Figure 2:
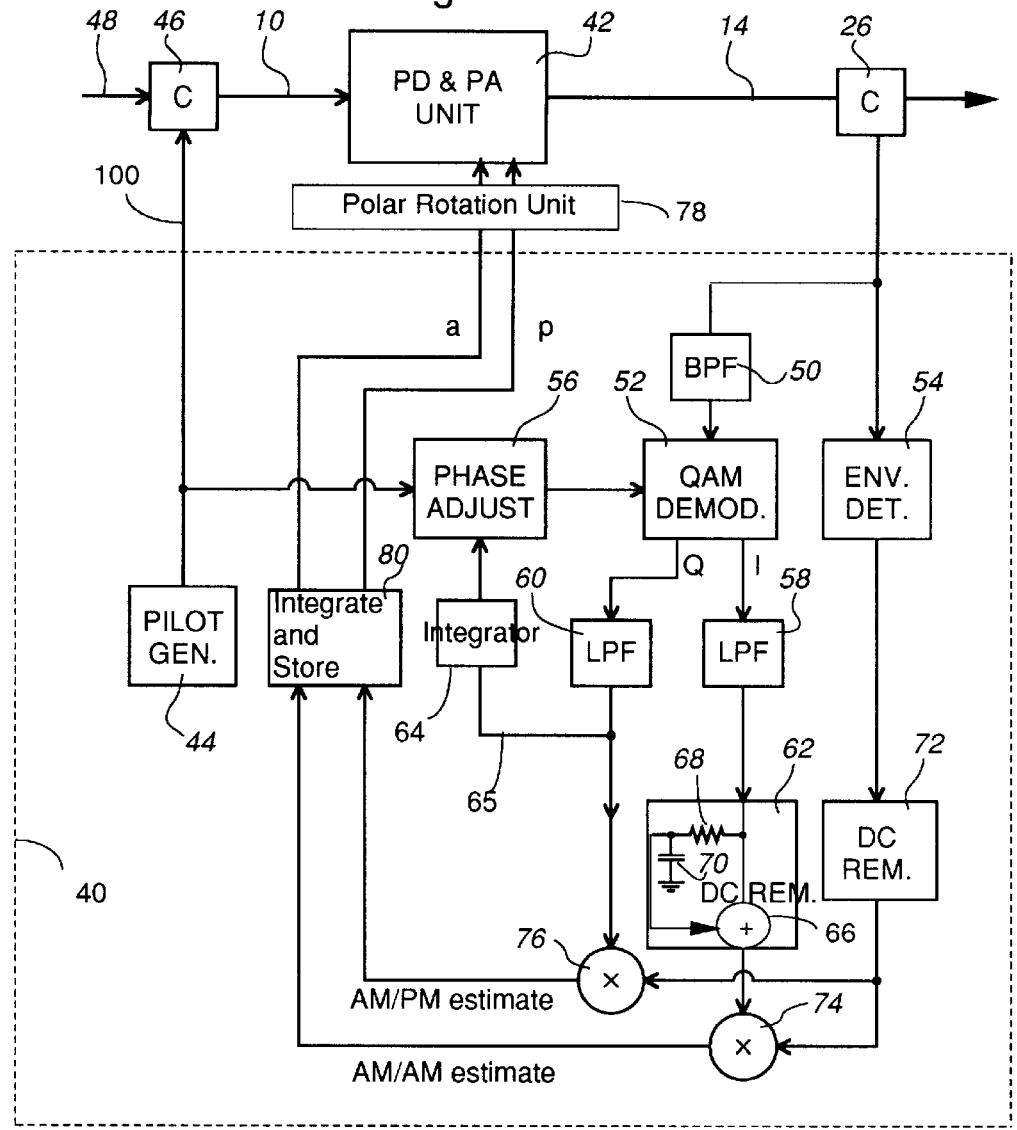
FIG. 2 schematically illustrates an amplifier and predistortion compensation control arrangement in accordance with an embodiment of the invention.

This invention is concerned particularly with the manner in which the 'a' and 'p' signals, which are the inputs into polar rotation unit 78, are produced, as illustrated in FIG. 2. In FIG. 2, all of the components of the arrangement of FIG. 1 inside box 42 are referred to as a feed forward predistorter and power amplifier (PD & PA) unit. FIG. 2 also shows polar rotation unit 78, initial coupler 46 for producing input 10 from an initial input signal 48 to the unit 42, the coupler 26, and the output 14 of the arrangement of FIG. 1. The remaining components illustrated in FIG. 2 serve as the control unit 40, as shown in phantom.

Referring to FIG. 2, control unit 40 is shown to include a pilot generator 44 which generates a pilot signal 100 at a frequency of, for example, 910 MHz, which serves as the reference signal. This frequency is chosen for convenience to be a little outside the signal band of the input signal 48 which, for this example, is between 869 and 894 MHz), so that the intermodulation products, as discussed below, can be more easily distinguished from the desired signals. Coupler 46 serves to couple the pilot signal from the generator 44, and the incoming RF signal from the input path 48, to form the input signal 10 to the unit 42.

Figure 4:
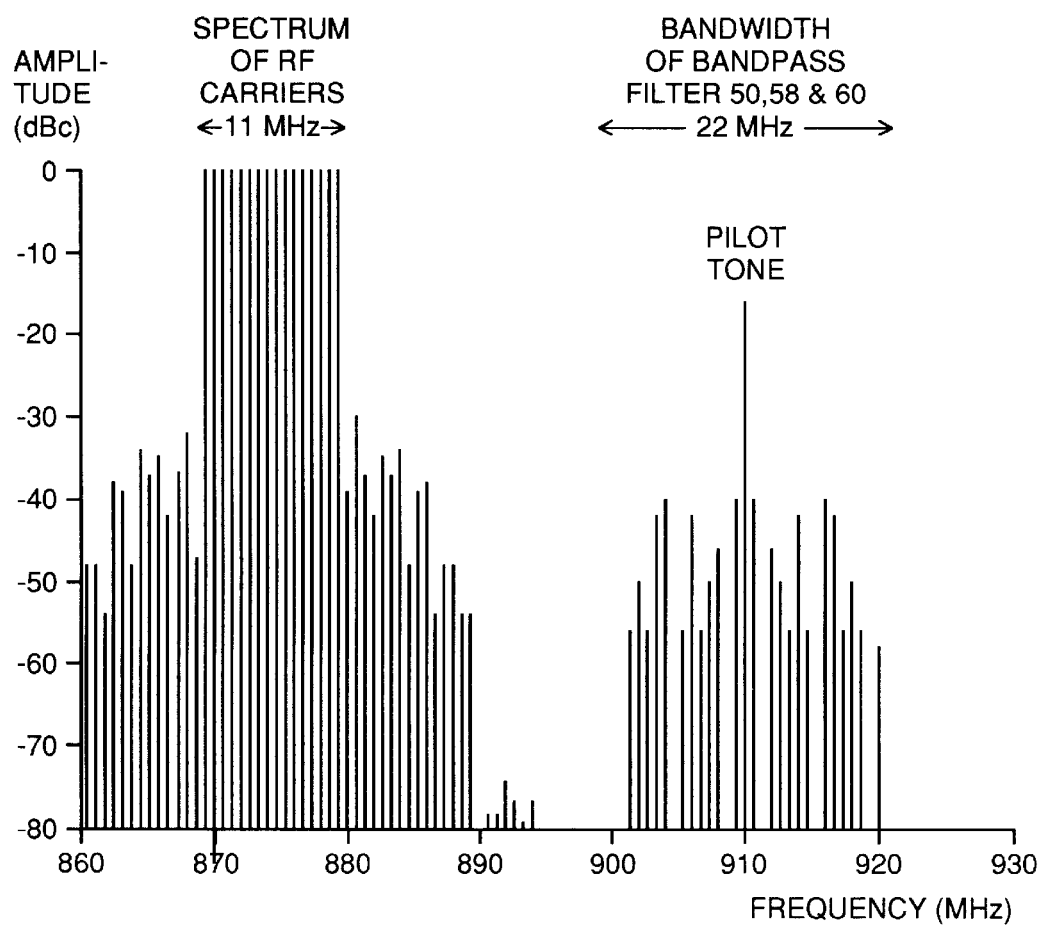

As can be appreciated from the foregoing description, the non-linear characteristics of the power amplifier result in interaction between the RF signal being amplified and the pilot signal. This interaction produces intermodulation products at frequencies centered at the pilot signal frequency, hereafter referred to as Reference Intermodulation Products (RIPS), and intermodulation products centered around the actual signals to be amplified (hereafter referred to as Signal Intermodulation Products (SIPs)), as shown in FIG. 4. The invention make use of a specific reference signal, for example, the pilot signal to isolate these RIPs in order to produce the feedback control signals a and p which minimize the RIPs produced. As a result of controlling the gain and phase adjustment unit 36 to minimize the RIPs produced, the SIPs produced by the predistortion unit 42 are minimized.

To do this, the reference signal is split into two paths. The first path is coupled to the incoming RF signal and amplified along with it, forming amplified output signal 14 as described above. This amplified signal is then QAM (Quadrature Amplitude Modulation) demodulated, with respect to an appropriately phase-shifted copy of the reference signal 44 (2nd path). As discussed below, this produces appropriate precursors of the "a" and "p" control signals; namely an "I" signal representing the gain change in the reference signal after amplification in PA 12, and a "Q" signal representing the phase change in the reference signal. More particularly, the "I" signal is a signal having a voltage which indicates the difference in gain, at any given moment in time, between the reference signal and the reference signal component of the amplified signal. Similarly, the "Q" signal, which in this case is the second difference signal, is a signal having a voltage which indicates the difference in phase, at any given moment in time, between the reference signal and the reference signal component of the amplified signal. The second path is used to control a feedback loop for controlling the QAM demodulator.

In the embodiment shown in FIG. 2, the portion of the output signal 14 which is coupled off by the coupler 26 is supplied to a bandpass filter 50. Bandpass filter 50 has a pass band centered at the pilot signal frequency and a bandwidth corresponding to twice the bandwidth of the RF signal being amplified, and substantially reduces the amplitude of the amplified RF signal outside this pass band. In other words, bandpass filter 50 serves to isolate the RIPS. The output of the bandpass filter 50 is supplied to a signal input of a QAM (Quadrature Amplitude Modulation) demodulator 52. The QAM demodulator 52 also has a local oscillator input which is supplied with the second path of the pilot signal from the generator 44 via a phase adjuster 56, which is controlled to adjust the phase of the pilot signal as described below.

The QAM demodulator 52 produces in-phase (I) and quadrature-phase (Q) demodulated output signals which are supplied to optional low pass filters 58 and 60 respectively.

Figure 3:
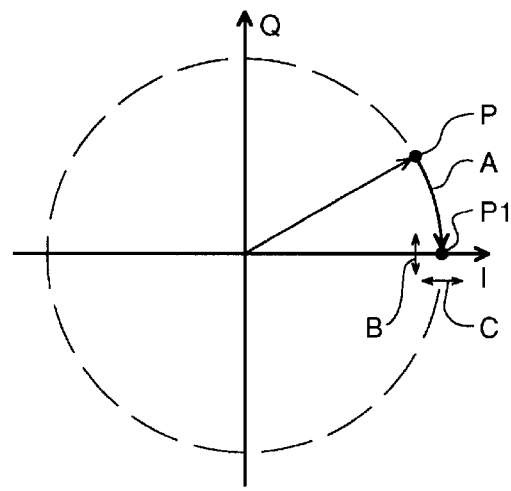
FIGS. 3 and 4 show respectively a phase plane diagram and a frequency spectrum diagram with reference to which the operation of the arrangement of FIG. 2 is explained.

The I and Q demodulated signals produced at the outputs of the QAM demodulator 52 track the in-phase and quadrature-phase components of the pilot tone and its intermodulation products as illustrated in FIGS. 3 and 4.

FIG. 4 is a frequency spectrum diagram, illustrating, by way of example, the relative amplitudes of different frequencies of an RF multi-channel signal, the pilot signal, and resulting intermodulation products of the RF signal amplified via the unit 42. In this example, the multi-channel signal comprises a plurality of RF carriers constituting the desired signal, at frequencies in a frequency band from 869 to 880 MHz. The bandwidth of the RF signal in this case is thus 11 MHz. As is well known for cellular radio communications systems, other RF carrier frequencies and other RF signal bandwidths may equally be used. Adjacent this desired RF signal band, at lower and higher frequencies, FIG. 4 shows that there are signal intermodulation products (SIPS) at lower amplitudes, these being due to distortion (non-linearity) in the power amplifier 12.

FIG. 4 also shows the pilot tone at a frequency of 910 MHz as described above, having an amplitude which is chosen for example to be at −30 dBc with respect to the total signal power. Also shown are reference intermodulation products (RIPS) at lower amplitudes, at frequencies above and below the pilot tone frequency, due to intermodulation between the pilot signal and the RF carriers of the multi-channel signal.

FIG. 4 also indicates a 22 MHz bandwidth of the predominant RIPS centered around the pilot signal. In this example, this 22 MHz bandwidth is equal to twice the RF signal bandwidth of 11 MHz for a power amplifier having conventional 3rd order non-linearity characteristics. In this example, a suitable bandpass of filter 50 is 22 MHz in order to isolate the RIPS and the low pass bandwidth of filters 60 and 58 is 11 MHz. As a result of suitable filtering, the QAM demodulator 52 is supplied with substantially only the pilot tone and the intermodulation products to which the pilot tone contributes; in other words, the bandpass and lowpass filters reject the high-amplitude RF carriers. Filters 58 and 60 may be omitted in some circumstances, depending on the quality of QAM demodulator 52, especially where the bandpass filter 50 is present. These filters may also be supplemented with, or replaced by, clipping, squaring, or other non-linear circuitry for the purpose of compensating for higher order distortion effects in the power amplifier 12.

Referring again to FIG. 2, the Q signal from LPF 60 is preferably supplied via integrator 64 as a control signal to the phase adjuster 56, thereby forming a control loop 65 to adjust the phase of the unamplified reference signal so that this signal is in phase with the amplified reference signal components (e.g. the RIPS) of the output 14 from the amplifier 12. This control loop can be understood with reference to FIG. 3. FIG. 3 is a phase plane diagram, with axes representing in conventional manner the amplitudes of the in-phase demodulated signal I and the quadrature-phase demodulated signal Q produced at the outputs of the QAM demodulator 52. A point P represents an arbitrary position corresponding to the I and Q signal magnitudes at an arbitrary time. This control loop serves to move the point P in the direction of an arrow A along a circular path (i.e. only the phase is changed) to the point P1 on the I-axis, i.e. the d.c. value of Q is zero. When phase shifter 56 is so adjusted, the Q signal is responsive to phase changes through unit 42 and the I signal is responsive to gain changes through unit 42.

A direct current (d.c.) component of the resulting I signal is removed by a d.c. remover circuit 62. As illustrated, the d.c. remover circuit 62 comprises a subtracter 66, a series resistor 68 and a shunt capacitor 70. The I signal is supplied to the additive (+) input of the subtracter 66, and a smoothed or integrated version of the incoming signal, produced by an integrator comprising series resistor 68 and shunt capacitor 70, is supplied to the subtracter's subtractive (−) input. The output of the subtracter 66 constitutes the output of the d.c. remover circuit 62. This output represents time varying fluctuations in the gain of unit 42 caused by AM/AM non-linearity.

A similar d.c. remover circuit 72 is supplied with the output of an envelope detector 54, which serves to provide a signal representative of the amplitude of the RF signal envelope. As shown, the input to envelope detector 54 is from coupler 26. It should be appreciated that the input to the envelope detector 54 could alternatively be derived from any point in the main RF signal path. The output signals from d.c. remover circuit 62 and low pass filter 60 are each correlated with the RF signal envelope amplitude by multiplying these signals by the output of the d.c. remover circuit 72 in multipliers 74 and 76 respectively.

The Q demodulated signal, derived from the output of the QAM demodulator 52 via the low pass filter 60 consists of a variable signal which indicates the AM/PM (amplitude modulation to phase modulation) distortion in the amplified reference signal produced by the power amplifier 12. This AM/PM distortion is represented in FIG. 3 by fluctuations of the point P1 in the directions shown by a double-headed arrow B. Thus the point P1 moves as indicated by the arrow B along part of the circular path. This movement corresponds to the phase modulation of the amplified reference signal resulting from the amplitude modulation of the main RF signal and the non-linear distortion of the power amplifier 12.

This amplitude-dependent phase variation is correlated with the amplitude of the RF signal envelope by the multiplier 76, which multiplies the output of the low pass filter 60 by the output of the envelope detector 54 after removal of its d.c. component by the d.c. remover circuit 72. The output of the multiplier 76 constitutes an AM/PM estimate or error signal whose average value is indicative of the sign and magnitude of the error in the AM/PM distortion compensation control 'p'. This AM/PM error signal determines both the magnitude and direction of the phase adjustment to be made.

The I demodulated signal derived from the output of the QAM demodulator 52 via the low pass filter 58 has its d.c. component removed by the d.c. remover circuit 62. The resulting signal indicates the AM/AM distortion produced by the power amplifier 12 and is represented in FIG. 3 by movement of the point P1 in the directions shown by a double-headed arrow C. Thus the point P1 moves as indicated by the arrow C radially with respect to the intersection of the I and Q axes, corresponding to amplitude modulation as a result of the amplitude modulation of the main RF signal and the non-linear distortion of the power amplifier 12. This amplitude variation is correlated with the amplitude of the RF signal envelope by multiplication of the outputs of the d.c. remover circuits 62 and 72 in the multiplier 74. The output of the multiplier 74, constitutes an AM/AM estimate or error signal whose average value is indicative of the sign and magnitude of the error in the AM/AM distortion compensation control "a". This AM/AM error signal determines both the magnitude and direction of the gain adjustment to be made.

The resulting control signals are buffered in the integrate and store unit 80 for controlling the gain and phase adjuster 36 via polar rotation unit 78. It should be noted that the AM/PM and AM/AM detector sensitivity approaches zero in the absence of either a RF carrier or sufficient envelope fluctuations. Thus, integrate and store 80 is preferably only updated if the main RF signal is of sufficiently large average signal power and exhibits sufficient envelope fluctuation. For example, a single FM modulated carrier may have insufficient envelope fluctuation, while the presence of two such FM carriers or a single wideband amplitude modulated carrier such as a signal from a multi user IS-95 Code Division Multiple Access base station is likely to provide sufficient envelope fluctuation. If the integrator is updated when there is no carrier or an insufficient envelope fluctuation, the offset voltages can cause the integrated signals to increase or decrease to the control limits. This can potentially result in transient intermodulation when additional carriers are added. In this situation, this transient intermodulation is avoided by storing the integrator outputs when there is insufficient RF power or envelope fluctuations. To this end, for example, updating of the store 80 is enabled by an output of a compactor (not shown) which compares the output of the envelope detector 54 with a fixed threshold level.

The arrangement described above operates on the principle that a reference signal, e.g. the pilot signal, added to the RF carriers, is subject to phase shift and gain change in accordance with the instantaneous RF carrier envelope and the non-linearity characteristics of unit 42. Thus the reference signal is subject to an amplitude-dependent phase shift and gain change (compression or expansion). Demodulating the reference signal at the output of unit 42 enables observation of the relationship between the reference signal phase and gain and the instantaneous RF envelope as detected at the output of unit 42. Multiplying the Q and RF envelope together provides an AM/PM error signal. High pass filtering the I and RF envelope terms and multiplying these together provides an AM/AM error signal. The AM/PM and AM/AM error signals are used to adjust the gain and phase of the compensating predistortion signal in a feedback loop in order to minimize the error signals, thereby providing optimal compensation for the power amplifier distortion.

Figure 5:
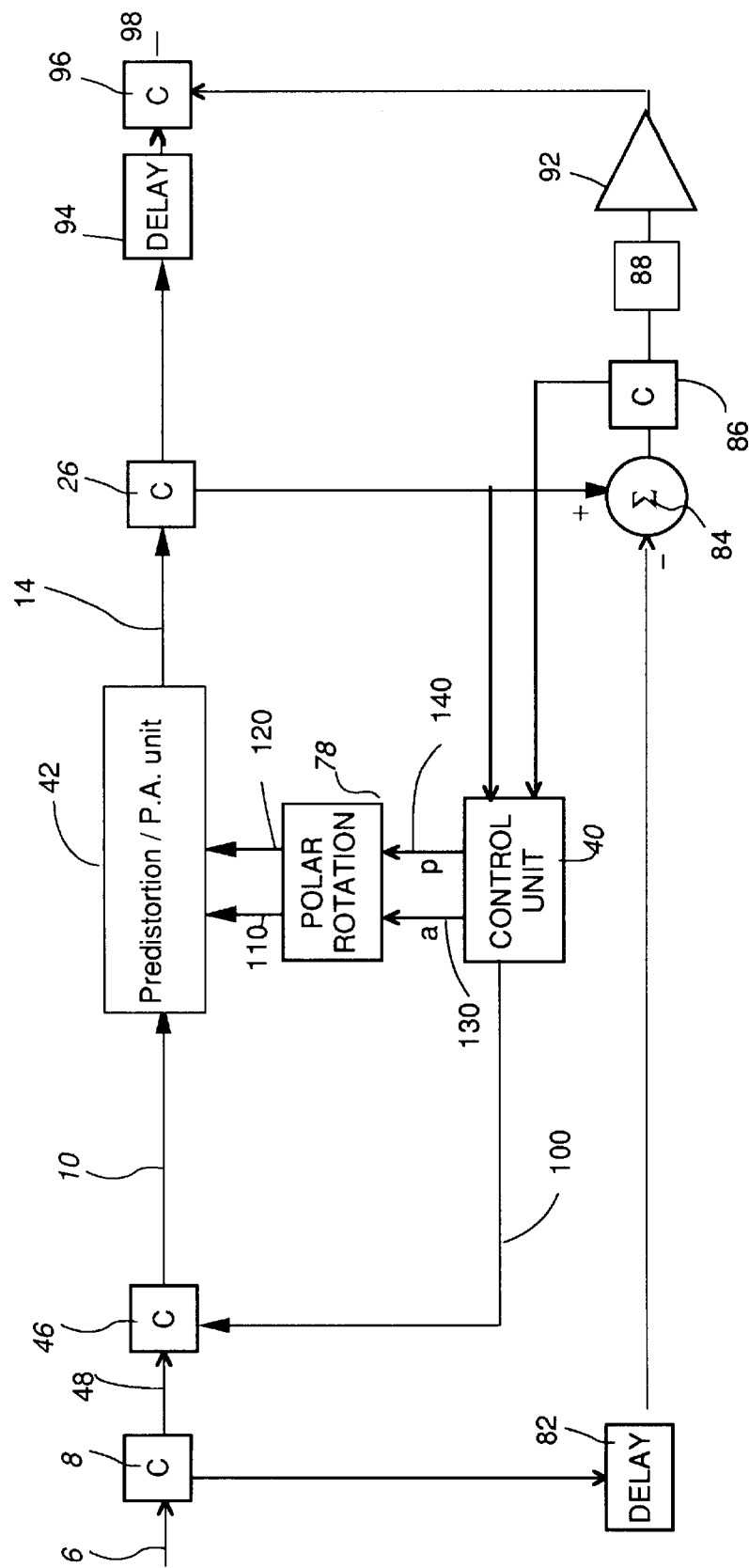
FIG. 5 illustrates a feed-forward arrangement used in conjunction with the embodiment of FIGS. 1 and 2.

The predistortion arrangement discussed above is used preferably in conjunction with a feed forward arrangement, as illustrated in FIG. 5. This feed-forward circuitry (comprising coupler 8, compensating delay 82, subtracter 84, phase inverting amplifier 92 and coupler 96, along with compensating delay 94 for producing output 98, as is known in the art) acts to cancel distortion which is not canceled by the predistortion arrangement. Furthermore, after the pilot has served its purpose in aiding predistortion control, the feed-forward circuitry usefully serves to largely cancel the pilot in output 98 via coupler 96; this cancellation is optimized by adjusting the gain and phase of the feed forward signal in gain and phase adjuster 88, as is known in the art.

It should be noted that, as shown in FIG. 4, a pilot signal frequency was chosen so that there is no considerable overlap of the frequency band of the pilot signal and its intermodulation products with the frequency band of the RF carriers and their intermodulation products. Any such overlap will reduce the effectiveness of the bandpass filter(s), resulting in increased variability or noise in the outputs of PD and PA unit 42. In order to attenuate the RF carriers in this case and hence reduce output variability, it is desirable to derive the input to the QAM demodulator 52 from after a cancellation point (e.g., after subtracter 84) of the feed forward path of the system as shown in FIG. 5. Thus, FIG. 5 also shows a coupler 86 for using the subtracted signal produced by subtracter 84 as an alternative input (not shown) to QAM demodulator 52 instead of the input as shown in FIG. 2. By using this signal, the RF carriers are substantially attenuated but with relatively little attenuation of the reference signal from which the AM/AM and AM/PM estimates are derived. As a result, variability in the outputs of PD & PA unit 42 are reduced. In this case in particular, the need for the bandpass filter 50 is reduced and thus can be omitted.

It should be noted that although in FIG. 4 the pilot signal is illustrated as a signal frequency tone, it should be appreciated by a person skilled in the art that the reference signal can be modulated to spread its energy over a wide frequency band, for example, using FM or spread spectrum PSK (phase shift key) modulation.

Although a particular implementation of the control arrangement has been described above, it should be appreciated that several alternatives can be used. For example, control loop 65 comprising integrator 64 can be eliminated. Instead, phase adjuster 56 is preset based on factory lookup tables determined by the actual frequency chosen as the pilot signal. In this case a DC remover circuit, similar to that shown at 62 will be used to move the DC component from the output of low pass filter 60 prior to mixing in mixer 76.

Furthermore, rather than inserting a pilot signal as a reference signal, the reference signal can be extracted from the input signal bandwidth. For example, the reference signal can be selected to be a carrier usually present in the RF signal, such as a beacon or control channel. If this approach is used then the bandpass filter 50 will not be able to isolate the amplified reference signal as it is part of the carrier. Consequently, the feed forward loop approach shown in FIG. 5, using the output from coupler 86 as the input to the QAM demodulator 52 is required. Also the factory lookup table approach for presetting phase adjuster 56 will also be required.

It should also be appreciated that one or both of the AM/PM and AM/AM error signals can be produced in other ways without requiring a QAM demodulator, and in some control arrangements only one of these error signals need be produced. For example, the reader is directed to McNicol, et al, U.S. Pat. No. 5,193,224, issued Mar. 9, 1993, the disclosure of which is hereby incorporated by reference.

Figure 6:
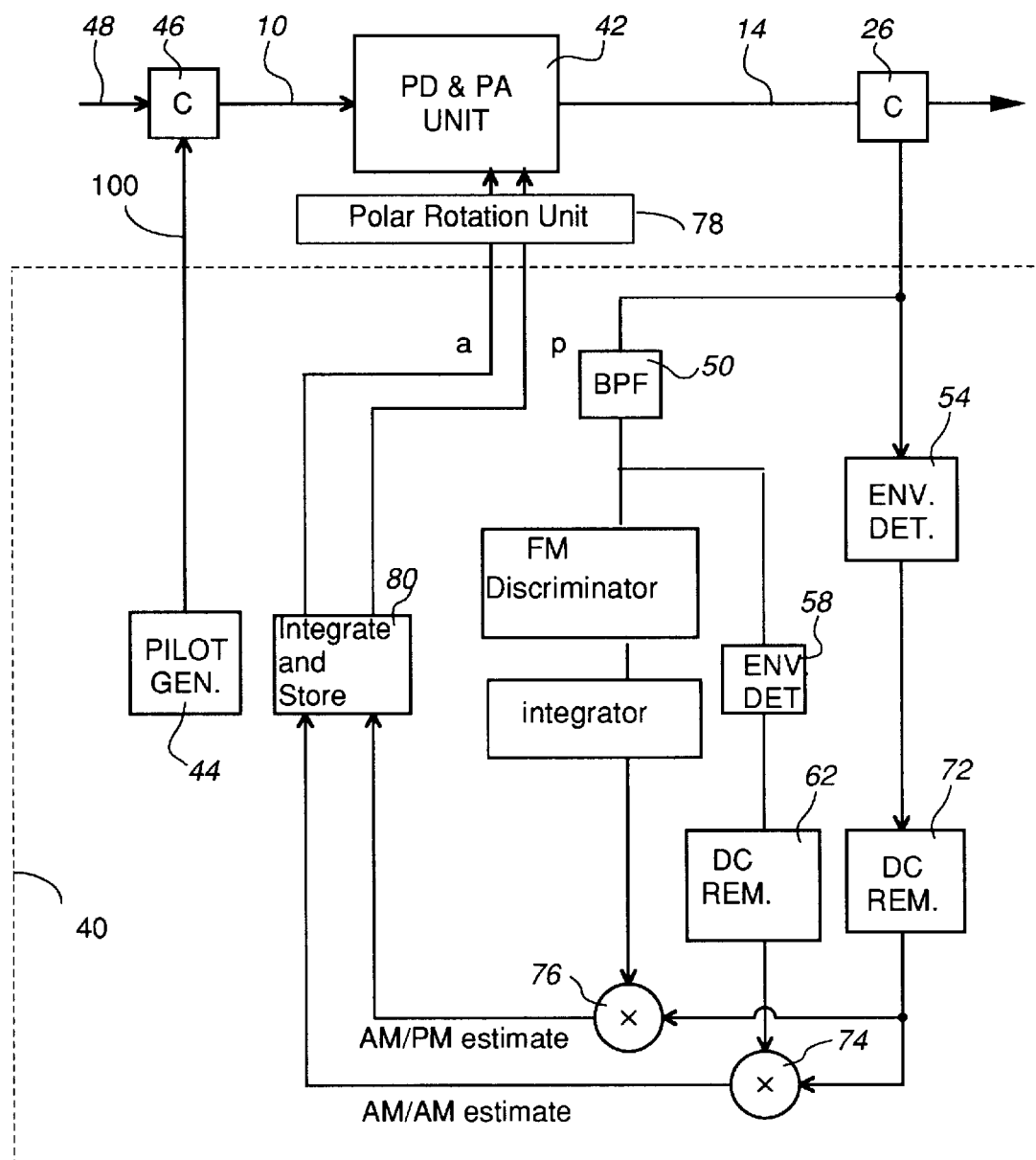
FIG. 6 illustrates an alternative embodiment of the control arrangement.

For another example, as shown in FIG. 6 in which the pilot signal is at a separate frequency from the carriers, as shown in FIG. 4, the AM/PM error signal can alternatively be produced by integrating the output of an FM discriminator centered at the pilot signal. Such a discriminator has its input supplied with a signal derived from the output of the bandpass filter 50.

Similarly, the AM/AM error signal is produced by removing the DC from the output of an envelope detector whose input is supplied with the output from bandpass filter 50.

The above description has shown various embodiments of the invention directed to a predistortion arrangement and how to control the gain and phase adjuster of such a predistortion arrangement. It should be appreciated by a person skilled in the art that such a control arrangement can also control the gain and phase of a compensation signal which, rather than being subtracted from the signal to be amplified prior to amplification as in the predistortion approach described above, as an alternative, the compensation signal can be used to cancel distortion introduced after amplification in a feed forward loop.

Numerous other modifications, variations, and adaptations may be made to the embodiments of the invention described above without departing from the scope of the invention as defined in the claims.

What is claimed is:

1. A distortion compensation circuit for a power amplifier comprising:

an input path for forwarding a combined signal to said amplifier to form an amplified signal, said combined signal comprising at least one carrier and a reference signal;

a compensation path for producing a compensation signal for compensating for the distortion produced by said amplifier;

a control unit;

coupler for coupling said amplified signal to said control unit; and said control unit comprising:

error signal means for producing a first signal indicative of the AM/AM distortion within an amplified reference signal component of said amplified signal and for producing a second signal indicative of the AM/PM distortion within said amplified reference signal component;

an envelope detector for detecting the instantaneous RF signal envelope of said amplified signal, a first mixer for correlating said first signal with said signal envelope in order to form a first error signal and a second mixer for correlating said second signal with said signal envelope in order to form a second error signal; and a gain and phase adjuster, responsive to said control unit, for adjusting the gain and phase of said compensation signal in order to minimize said error signals.

2. A distortion compensation circuit as claimed in claim 1, wherein said error signals indicate both the sign and the magnitude of the adjustments made by said gain and phase adjuster.

3. A distortion compensation circuit as claimed in claim 2, wherein said error signal means comprises an FM discriminator and integrator for producing said first signal and an envelope detector or an AM discriminator for producing said second signal.

4. A distortion compensation circuit as claimed in claim 2, herein said error signal means comprises a QAM demodulator and wherein said control unit further comprises oscillator coupling means for coupling said reference signal to said QAM demodulator's local oscillator input.

5. A distortion compensation circuit as claimed in claim 2, wherein said input path comprises:

means for receiving an RF signal to be amplified;

means for producing a reference signal; and means for coupling said reference signal with said RP signal to form a combined signal to be amplified.

6. A distortion compensation circuit as claimed in claim 4, wherein said input path comprises:

means for receiving an RF signal to be amplified, said RF signal comprising said at least one carrier signal and said reference signal; and means for coupling said reference signal to said oscillator coupling means.

7. A distortion compensation circuit as claimed in claim 4, wherein said oscillator coupling means further comprises phase adjuster for adjusting the phase of said reference signal.

8. A distortion compensation circuit as claimed in claim 7, wherein said coupling means further comprises a feedback loop coupled to a quadrature-phase (Q) demodulated output signal from said QAM demodulator for controlling said phase adjuster.

9. A distortion compensation circuit as claimed in claim 8, wherein said power amplifier has a non-linear characteristic and further comprising a polar rotation unit having an angle selected in accordance with the non-linear characteristic.

10. A distortion compensation circuit as claimed in claim 9, wherein said control unit further comprises an integrate and store unit.

11. A method of minimizing the intermodulation distortion produced by a RF power amplifier comprising the steps of:

(a) introducing an RF signal to be amplified, said RF signal including a reference signal;

(b) producing a compensation signal which will largely cancel the distortion produced by the RF power amplifier;

(c) producing a pair of error signals indicative of the sign and magnitude of the distortion introduced by said RF power amplifier to the reference signal; and (d) adaptively adjusting the gain and phase of said compensation signal in order to minimize said error signals.

12. A method as claimed in claim 11, wherein step (c) comprises isolating the amplified reference signal component of the output of said RF power amplifier;

comparing said amplified reference signal component with said reference signal in order to produce:

a first signal indicative of the difference in gain between said reference signal and said amplified reference signal component; and a second signal indicative of the difference in phase between said reference signal and said amplified reference signal component.

13. A method as claimed in claim 12, further comprising the step of determining the instantaneous RF signal envelope of said amplified signal and wherein step (c) further comprises the steps of:

correlating said first signal with said signal envelope in order to form a signal indicative of the sign and magnitude of the gain adjustment to be made; and correlating said second signal with said signal envelope in order to form a signal indicative of the sign and magnitude of the phase adjustment to be made.

14. A method as claimed in claim 12, herein said comparing step comprises the step of using a QAM demodulator to QAM demodulate said amplified reference signal component, using an unamplified copy of said reference signal as the oscillator input to said QAM demodulator.

15. A method as claimed in claim 13 wherein step (a) comprises the step of generating an coupling a reference signal to the RF signal to be amplified.

16. A method as claimed in claim 14 herein said compensation signal is a predistortion signal.

17. A method as claimed in claim 14 wherein said compensation signal is used to cancel said distortion after amplification by said RF power amplifier in a feed forward loop.

18. A method as claimed in claim 11, wherein step (c) comprises the steps of:

isolating the amplified reference signal component of the output of said RF power amplifier;

using an FM discriminator centered at said reference signal frequency to produce a first signal indicative of AM/PM distortion within said amplified reference signal component; and using an envelope detector or an AM discriminator to produce a second signal indicative of the AM/AM distortion with said amplified reference signal component.

19. A method as claimed in claim 18, further comprising the step of determining the instantaneous RF signal envelope of said amplified signal and wherein step (c) further comprises the steps of:

correlating said first signal with said signal envelope in order to form a signal indicative of the sign and magnitude of the gain adjustment to be made; and correlating said second signal with said signal envelope in order to form a signal indicative of the sign and magnitude of the phase adjustment to be made.

* * * * *